United States Patent [19]

Tucker et al.

[11] Patent Number: 5,227,736
[45] Date of Patent: Jul. 13, 1993

[54] SECOND-ORDER PREDISTORTER

[75] Inventors: Mark E. Tucker, San Diego; Stewart L. Cummings, Oceanside, both of Calif.

[73] Assignee: Tacan Corporation, Carlsbad, Calif.

[21] Appl. No.: 884,367

[22] Filed: May 18, 1992

[51] Int. Cl.[5] .............................................. H03F 1/32
[52] U.S. Cl. .................................. 330/149; 328/163; 359/180
[58] Field of Search ..................... 330/149; 328/163; 332/160; 359/174, 180, 189; 375/60; 455/50.1, 63

[56] References Cited

U.S. PATENT DOCUMENTS 4,531,098  7/1985  Reed ............................. 330/149 X
4,992,754  2/1991  Blauvelt et al. ..................... 330/149

Primary Examiner—James B. Mullins
Attorney, Agent, or Firm—Brown, Martin, Haller & McClain

[57] ABSTRACT

The second-order predistorter comprises two RF amplifiers and three 180° hybrid combiner/splitters. The RF sinusoidal input is split into two separate signals which have equal amplitudes but are 180° out of phase. Each of these signals is fed into separate moderately linear amplifiers, the output of each being composed only of the amplified input signal and second-order distortion components produced by the amplifiers' non-linearities. The output signal from each amplifier is combined with the other in a second combiner/splitter to produce two different outputs consisting of the sum and difference of the amplified signals. The difference signal consists only of the desired signal, and the sum signal consists of only the second-order distortion terms. The sum and difference signals are recombined in a third combiner/splitter to form a composite signal which is input into the device to be linearized. The output signal of the final hybrid combiner/splitter is taken from its sum or its difference port, depending on the desired relative phase between the amplified signals.

18 Claims, 1 Drawing Sheet

SECOND-ORDER PREDISTORTER

BACKGROUND OF THE INVENTION

Fiber-optic transmission systems offer an alternative to current transmission techniques for CATV systems, which typically include long chains of repeater amplifiers. One of the drawbacks of fiber-optic systems is that the inherent nonlinearity in many analog transmitters prevents a linear electrical modulation signal from being linearly converted to an optical transmission signal by modulation of a diode laser. These distortions present a significant obstacle to successful implementation of such systems since linearity is critical in preventing cross-talk between the closely-spaced channels. A well known source of these distortions is second and higher order intermodulation products. Diode lasers with low second order distortion are commercially available, but they are expensive and severely limited in supply due to low fabrication yields. Two well known means for minimizing the effects of the nonlinearity and distortion are negative feedback and predistortion.

A number of predistortion techniques have been described in the literature to reduce distortion. These techniques involve combination of the modulation signal with a signal which is equal in magnitude to the distortion but opposite in sign such that the distortion is cancelled.

Many predistortion techniques divide an input RF signal into two or more electrical paths, then generate predistortion in one or more of the paths, with the predistortion resembling the device's inherent distortion. Attenuation can be used to control the magnitude of the predistortion so that it matches that of the device's inherent distortion. A number of different circuit configurations have been devised to accomplish predistortion in this manner.

In U.S. Pat. No. 4,992,754 of Blauvelt et al. a portion of the main signal is split off into the predistorter in which a push-push amplifier is used to produce second-order distortions. These distortions are adjusted in phase and amplitude and recombined with the main path signal. The composite signal is then fed into the device to be linearized.

The predistortion linearization technique of R. B. Childs and V. A. O'Byrne disclosed in "Multichannel AM Video Transmission Using a High-Power Nd:YAG Laser and Linearized External Modulator", IEEE J. on Selected Areas in Comm., Vol. 8, No. 7, September 1990, pp. 1369–1376, utilizes a circuit with a number of diodes in series, with bias currents being used to match third-order distortions to those of the modulator so that cancellation can occur.

Other techniques and circuit configurations have included combination of a pair of anti-parallel diodes and a linear impedance by a 90° or 180° hybrid-B (Nojima and Konno, "Cuber Predistortion Linearizer for Relay Equipment in 800 MHz Band Land Mobile Telephone System", IEEE Trans. on Veh. Tech., Vol. VT-34, No. 4, November 1985, pp. 169–177); and balanced amplifiers, phase shifters and p-i-n attenuators (Inada et al., "A Compact 4-GHz Linearizer for Space Use", IEEE Trans. on Micro. Theory and Tech., Vol. MTT-34, No. 12, December 1986, p. 1327).

SUMMARY OF THE INVENTION

It is an object of the present invention to provide a new predistortion circuit for reduction of second-order distortions produced by an intensity modulated laser diode or light emitting diode (LED).

It is another object of the present invention to provide a device to greatly increase the yield and reduce the cost of commercially-available CATV fiber-optic links.

In an exemplary embodiment, the second-order predistorter comprises two RF amplifiers and three 180° hybrid combiner/splitters. The RF sinusoidal input is split into two separate signals which have equal amplitudes but are 180° out of phase. Each of these signals is fed into a separate moderately linear amplifier, the output of which is composed of only the amplified input signal and the second-order distortion components produced by the amplifier's nonlinearities. The output signal from each amplifier is combined with the other in a second combiner/splitter to produce two different outputs consisting of the sum and difference of the amplified signals. The difference signal consists only of the desired signal, and the sum signal consists of only the second-order distortion terms. The sum and difference signals are recombined in a third combiner/splitter to form a composite signal which is input into the device to be linearized. The output signal of the final hybrid combiner/splitter is taken from its sum or difference port, depending on the desired relative phase between the amplified signals. The appropriate output is chosen to provide complementary distortion components to those being produced in the laser diode or LED to be linearized.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
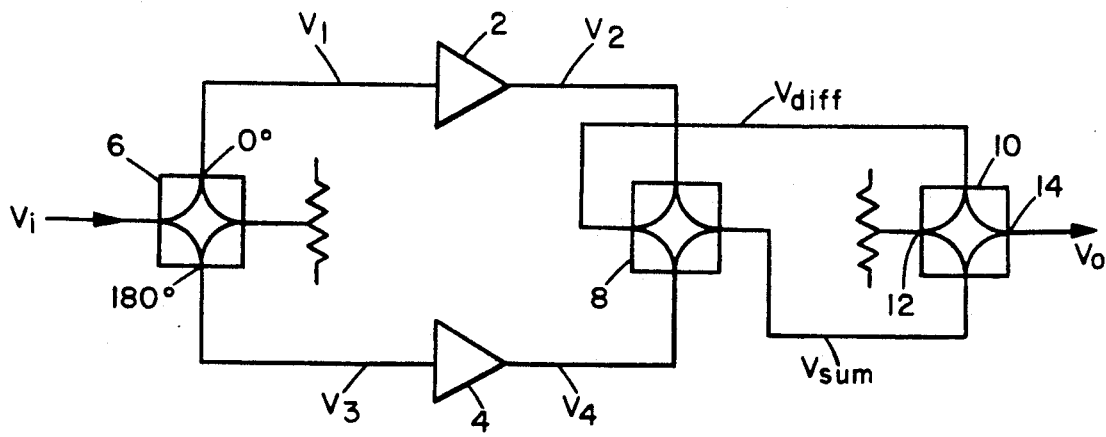
FIG. 1 is a block diagram of a first embodiment of the second-order predistorter.

The second-order predistorter of the present invention comprises two RF amplifiers 2 and 4, and three 180° hybrid combiner/splitters 6, 8 and 10. As illustrated in FIG. 1, the RF sinusoidal input $V_i$ is split by 180°-hybrid 6 into two separate signals, $V_1$ and $V_3$, which have identical amplitudes but differ in phase by 180°. Each of the signals $V_1$ and $V_3$ is fed into a moderately-linear RF amplifier 2 and 4, respectively. The output signals $V_2$ and $V_4$ of the two amplifiers 2 and 4 are composed of the amplified input signal $V_i$ and second-order distortion components produced by the nonlinearities of the amplifier 2 or 4. The outputs $V_2$ and $V_4$ of the two amplifiers are then combined into 180°-hybrid 8 which produces two distinctly different outputs $V_{diff}$ and $V_{sum}$. The output labelled $V_{diff}$ is equal to the difference between the two signals $V_2$ and $V_4$ and is composed of the desired, or fundamental, signal only, plus gain. Second-order intermodulations present in $V_2$ and $V_4$ have been cancelled in the $V_{diff}$ output by the push-pull action of the circuit. The output labelled $V_{sum}$ is equal to the sum of the two signals $V_2$ and $V_4$, and is composed of second-order terms only. The second-order distortions have been isolated and increased in amplitude due to the push-push action of the circuit. $V_{sum}$ and $V_{diff}$ are then combined into 180°-hybrid 10 to produce a composite signal $V_o$ which is then input into the device to be linearized. The output of hybrid 10 can be taken out of either the sum port 12 or the difference port 14, depending on the desired relative phase between $V_{diff}$ and $V_{sum}$ (either 0° or 180°).

The operation to the predistorter of FIG. 1 may be explained by the following equations:

The transfer function of amplifier 2 is $$A_1 V_1 - A_2 V_1^2 = V_2$$

and the transfer function for amplifier 4 is $$A_1 V_3 - A_2 A_3^2 = V_4$$

where $$V_1 = \frac{V_i}{\sqrt{2}};$$

$$V_3 = \frac{V_i}{\sqrt{2}} \angle 180°;$$

$$V_2 = A_1 \frac{V_i}{\sqrt{2}} - A_2 \left(\frac{V_i}{\sqrt{2}}\right)^2; \text{ and}$$

$$V_4 = A_1 \frac{V_i}{\sqrt{2}} \angle 180° - A_2 \left(\frac{V_i}{\sqrt{2}} \angle 180°\right)^2.$$

The outputs of hybrid 8, $V_{sum}$ and $V_{diff}$, are $V_{sum} =$ $$\frac{1}{\sqrt{2}} \left( A_1 \frac{V_i}{\sqrt{2}} - A_2 \frac{V_i^2}{2} + A_1 \frac{V_i}{\sqrt{2}} \angle 180° - A_2 \frac{V_i^2}{2} \angle 0° \right)$$

$$= \frac{1}{\sqrt{2}} (-A_2 V_i^2) = \frac{-A_2}{\sqrt{2}} V_i^2 \text{ and}$$

The resultant output voltage $V_0$ is $$V_{diff} = \frac{1}{\sqrt{2}} \left( A_1 \frac{V_i}{\sqrt{2}} - A_2 \frac{V_i^2}{2} + A_1 \frac{V_i}{\sqrt{2}} \angle 0° - \right.$$

$$\left. A_2 \left( \frac{V_i^2}{2} \angle 0° \right) \angle 180° \right)$$

$$= \frac{1}{\sqrt{2}} \left( 2 A_1 \frac{V_i}{\sqrt{2}} \right) = A_1 V_i.$$

$$\frac{1}{\sqrt{2}} \left( A_1 V_i - \frac{A_2}{\sqrt{2}} V_i^2 \right).$$

Figure 2:
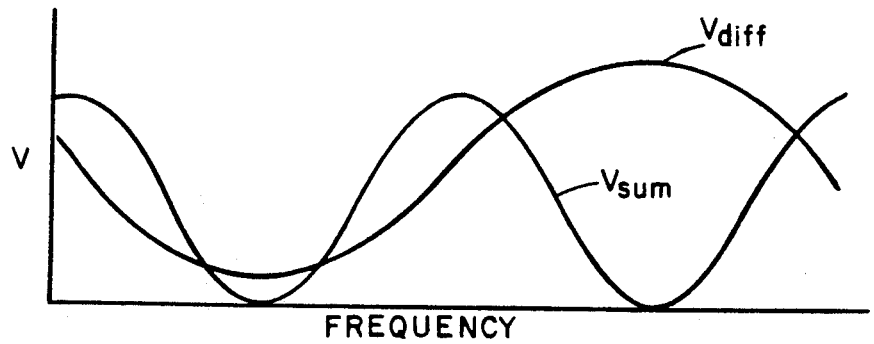
FIG. 2 is a plot of relative phase of $V_{diff}$ and $V_{sum}$.

FIG. 2 illustrates a plot resulting from a computer simulation of the predistorter of FIG. 1. The plot shows the relative phase of $V_{diff}$ and $V_{sum}$, the fundamental and second-order components of the signal, respectively. The second-order signal $V_{sum}$ leads the fundamental signal by 90°. If the signals are combined in 180°-hybrid 10 and the output is taken from the sum port 12, the resulting sinusoid will be compressed on positive-going peaks and expanded on negative-going peaks. If the output of hybrid 10 is taken from the difference port 14, the resulting sinusoid will be compressed on negative-going peaks and expanded on positive-going peaks. The appropriate output from the final hybrid 10 must be chosen to provide complementary distortion components to those being produced in the laser diode or the LED that is to be linearized.

The choice of whether to use the in-phase or out-of-phase output of 180°-hybrid 10 is made by inspecting the output light intensity versus input current transfer function for a typical laser diode or LED. This transfer function usually deviates from a straight line at higher current drive levels. The bending of the L-I curve at higher currents causes compression of the positive-going peaks of the intensity modulated signal from the laser. Therefore, the phase of the output from hybrid 10 must be chosen to provide expansion of the positive-going peaks of the predistorter's output waveform to properly compensate the second-order distortion produced by the laser. In the simplified configuration of the predistorter illustrated in FIG. 1, the difference output 14 of hybrid 10 would have the appropriate phasing to compensate for the laser second-order distortion.

Figure 3:
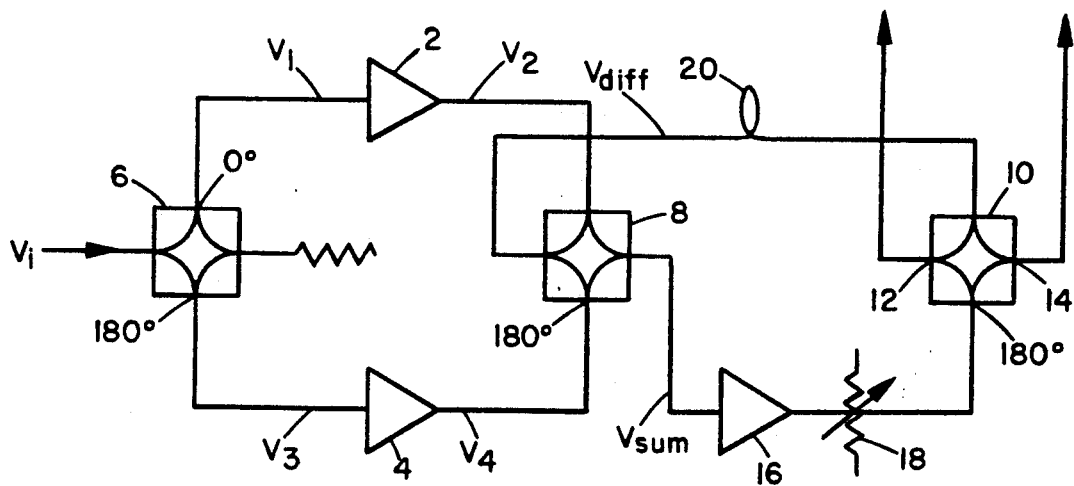
FIG. 3 is a block diagram of a second embodiment of the second-order predistorter.

The circuit illustrated in FIG. 3 is that of a predistorter to which has been added an inverting amplifier 16 and variable attenuator 1B in the second-order path ($V_{sum}$). The amplifier 16 and attenuator 18 combination allows adjustment of the amplitude of the second-order components to match the level of those produced by the laser diode. The inverting amplifier 16 in the second-order path produces a 180° phase shift in the distortion products through the path $V_{sum}$. This inversion reverses the phase relationship of the fundamental signal relative to the second-order signal out of the final hybrid 10 so that it is opposite to the phasing illustrated in FIG. 1. In the configuration in FIG. 3, the sum output of hybrid 10 would have the appropriate phasing to compensate for laser second-order distortion. A delay line 20 is also included from points 9-11. The length of delay line 20 is chosen to provide exactly the same time delay that exists in the second-order path 5-13. Without the delay line 20, the relative phase of the fundamental and second-order components would vary as a function of frequency. This phase variation would reduce the cancellation of laser distortions across the operating frequency band.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A predistortion circuit for compensating for distortions produced by an optical source comprising:
   a first combiner/splitter for splitting an input signal into two signals each having a 180° phase difference from the other;

two amplifiers, each for receiving one of said two signals and providing an amplified output signal having a second-order distortion component and a fundamental signal component;

a second combiner/splitter for combining the amplified output signal of each amplifier and for providing a sum output and a difference output therefrom;

a third combiner/splitter for combining said sum output and said difference output and having a final output for providing a predistorter output signal having a desired relative phase difference between said sum output and said difference output for cancelling said distortions produced by said optical source.

2. A predistortion circuit as in claim 1 wherein said amplifier is moderately linear.

3. A predistortion circuit as in claim 1 wherein said first combiner/splitter is a 180° hybrid combiner/splitter.

4. A predistortion circuit as in claim 1 wherein said second combiner/splitter is a 180° hybrid combiner/splitter.

5. A predistortion circuit as in claim 1 wherein said third combiner/splitter is a 180° hybrid combiner/splitter.

6. A predistortion circuit as in claim 1 wherein said final output is a sum final output whereby said predistorter output signal comprises a sinusoid having compressed positive-going peaks and expanded negative-going peaks.

7. A predistortion circuit as in claim 1 wherein said final output is a difference final output whereby said predistorter output signal comprises a sinusoid having expanded positive-going peaks and compressed negative-going peaks.

8. A predistortion circuit as in claim 1 further comprising an inverting amplifier disposed in a second-order path carrying said sum output.

9. A predistortion circuit as in claim further comprising a variable attenuator disposed in a second-order path carrying said sum output.

10. A predistortion circuit as in claim 1 further comprising a delay line disposed in a fundamental path carrying said difference output.

11. A method of compensating for second-order distortions produced by an optical source which comprises:

splitting an input signal from a modulation signal source into two signals having a 180° phase difference from each other;

amplifying each signal with an amplifier to provide an amplifier output having a fundamental signal component and a second-order distortion component;

recombining each amplified output;

splitting the recombined amplified output into a sum output and a difference output;

combining said sum output and said difference output to produce a predistorter output; and applying said predistorter output to said optical source input to substantially cancel said second-order distortions.

12. A method as in claim wherein the step of combining said sum output and said difference output further comprises selecting an output port to provide a desired relative phase difference between said sum output and said difference output.

13. A method as in claim 12 wherein the step of selecting an output port includes selecting a sum final output port so that said predistorter output signal comprises a sinusoid having compressed positive-going peaks and expanded negative-going peaks.

14. A method as in claim 12 wherein the step of selecting an output port includes selecting a difference output port so that said predistorter output signal comprises a sinusoid having expanded positive-going peaks and compressed negative-going peaks.

15. A method as in claim further comprising reversing the phase relationship between a fundamental component and a second-order component of said predistorter output signal.

16. A method as in claim further comprising adjusting an amplitude of a second-order component of said predistorter output signal to match a level of second-order components produced by said modulator signal source.

17. A method as in claim 11 which further comprises matching a time delay in said different output and said sum output.

18. A method as in claim 17 which further comprises adding a time delay to said difference output.

* * * * *

UNITED STATES PATENT AND TRADEMARK OFFICE
CERTIFICATE OF CORRECTION

PATENT NO. : 5,227,736
DATED : July 13, 1993
INVENTOR(S) : Mark E. Tucker

It is certified that error appears in the above-identified patent and that said Letters Patent is hereby corrected as shown below:

Column 5, Claim 9, line 42, after "claim" insert --1--;

Column 6, Claim 16, line 38, after "claim" insert --11--;

Signed and Sealed this

Eighth Day of March, 1994

Attest:

BRUCE LEHMAN

*Attesting Officer*  *Commissioner of Patents and Trademarks*